(12) United States Patent
Raring et al.

(10) Patent No.: US 8,767,787 B1
(45) Date of Patent: *Jul. 1, 2014

(54) INTEGRATED LASER DIODES WITH QUALITY FACETS ON GAN SUBSTRATES

(75) Inventors: James W. Raring, Fremont, CA (US); Daniel F. Feezell, Fremont, CA (US)

(73) Assignee: Soraa Laser Diode, Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/546,943

(22) Filed: Jul. 11, 2012

Related U.S. Application Data

(63) Continuation-in-part of application No. 12/502,058, filed on Jul. 13, 2009, now Pat. No. 8,259,769.

(60) Provisional application No. 61/080,655, filed on Jul. 14, 2008.

(51) Int. Cl.
*H01S 5/00* (2006.01)

(52) U.S. Cl.
USPC ............ 372/44.011; 372/43.01; 372/93; 372/99

(58) Field of Classification Search
CPC ..... H01S 5/3202; H01S 5/0202; H01S 5/101; H01S 5/22; H01S 5/0206; H01S 2304/04
USPC .............. 372/44.011, 43.01, 93, 99
See application file for complete search history.

(56) References Cited

U.S. PATENT DOCUMENTS

| | | | |
|---|---|---|---|
| 4,318,058 A | 3/1982 | Mito et al. | |
| 5,331,654 A | 7/1994 | Jewell et al. | |
| 5,647,945 A | 7/1997 | Matsuse et al. | |
| 6,072,197 A | 6/2000 | Horino et al. | |
| 6,195,381 B1 | 2/2001 | Botez et al. | |

(Continued)

FOREIGN PATENT DOCUMENTS

| | | |
|---|---|---|
| CN | 101009347 | 3/1987 |
| CN | 1538534 | 10/2004 |

(Continued)

OTHER PUBLICATIONS

Feezell et al. 'Development of nonpolar and semipolar InGaN/GaN visible light-emitting diodes', MRS Bulletin, vol. 34, May 2009, pp. 318-323.

(Continued)

*Primary Examiner* — Kinam Park
(74) *Attorney, Agent, or Firm* — Kilpatrick Townsend & Stockton LLP

(57) ABSTRACT

A laser diode device operable at a one or more wavelength ranges. The device has a first waveguide provided on a non-polar or semipolar crystal plane of gallium containing material. In a specific embodiment, the first waveguide has a first gain characteristic and a first direction. In a specific embodiment, the first waveguide has a first end and a second end and a first length defined between the first end and the second end. The device has a second waveguide provided on a non-polar or semipolar crystal plane of gallium containing material. In a specific embodiment, the second waveguide has a second gain characteristic and a second direction. In a specific embodiment, the second waveguide has a first end, a second end, and a second length defined between the first end and the second end.

22 Claims, 5 Drawing Sheets

An example embodiment on semipolar (11-22) oriented GaN

(56) References Cited

U.S. PATENT DOCUMENTS

| | | | |
|---|---|---|---|
| 6,639,925 | B2 | 10/2003 | Niwa et al. |
| 6,809,781 | B2 | 10/2004 | Setlur et al. |
| 6,858,882 | B2 | 2/2005 | Tsuda et al. |
| 7,019,325 | B2 | 3/2006 | Li et al. |
| 7,053,413 | B2 | 5/2006 | D'Evelyn et al. |
| 7,119,487 | B2 | 10/2006 | Ikeda |
| 7,128,849 | B2 | 10/2006 | Setlur et al. |
| 7,358,542 | B2 | 4/2008 | Radkov et al. |
| 7,358,543 | B2 | 4/2008 | Chua et al. |
| 7,483,466 | B2 | 1/2009 | Uchida et al. |
| 7,483,468 | B2 | 1/2009 | Tanaka |
| 7,491,984 | B2 | 2/2009 | Koike et al. |
| 7,598,104 | B2 | 10/2009 | Teng et al. |
| 7,709,284 | B2 | 5/2010 | Iza et al. |
| 7,733,571 | B1 | 6/2010 | Li |
| 7,858,408 | B2 | 12/2010 | Mueller et al. |
| 7,862,761 | B2 | 1/2011 | Okushima et al. |
| 7,923,741 | B1 | 4/2011 | Zhai et al. |
| 7,939,354 | B2 | 5/2011 | Kyono et al. |
| 8,044,412 | B2 | 10/2011 | Murphy et al. |
| 8,124,996 | B2 | 2/2012 | Raring et al. |
| 8,126,024 | B1 | 2/2012 | Raring |
| 8,143,148 | B1 | 3/2012 | Raring et al. |
| 8,242,522 | B1 | 8/2012 | Raring |
| 8,247,887 | B1 | 8/2012 | Raring et al. |
| 8,254,425 | B1 | 8/2012 | Raring |
| 8,259,769 | B1 * | 9/2012 | Raring et al. ............ 372/44.011 |
| 8,284,810 | B1 | 10/2012 | Sharma et al. |
| 8,294,179 | B1 | 10/2012 | Raring |
| 8,314,429 | B1 | 11/2012 | Raring et al. |
| 8,350,273 | B2 | 1/2013 | Vielemeyer |
| 8,351,478 | B2 | 1/2013 | Raring et al. |
| 8,355,418 | B2 | 1/2013 | Raring et al. |
| 8,416,825 | B1 | 4/2013 | Raring |
| 8,422,525 | B1 | 4/2013 | Raring et al. |
| 8,427,590 | B2 | 4/2013 | Raring et al. |
| 8,451,876 | B1 | 5/2013 | Raring et al. |
| 2001/0048114 | A1 | 12/2001 | Morita et al. |
| 2002/0027933 | A1 | 3/2002 | Tanabe et al. |
| 2002/0105986 | A1 | 8/2002 | Yamasaki |
| 2003/0129810 | A1 | 7/2003 | Barth et al. |
| 2003/0178617 | A1 | 9/2003 | Appenzeller et al. |
| 2003/0200931 | A1 | 10/2003 | Goodwin |
| 2004/0099213 | A1 | 5/2004 | Adomaitis et al. |
| 2004/0146264 | A1 | 7/2004 | Auner et al. |
| 2004/0233950 | A1 | 11/2004 | Furukawa et al. |
| 2005/0214992 | A1 | 9/2005 | Chakraborty et al. |
| 2005/0218413 | A1 | 10/2005 | Matsumoto et al. |
| 2005/0230701 | A1 | 10/2005 | Huang |
| 2005/0247260 | A1 | 11/2005 | Shin et al. |
| 2005/0286591 | A1 | 12/2005 | Lee |
| 2006/0033009 | A1 | 2/2006 | Kobayashi et al. |
| 2006/0077795 | A1 | 4/2006 | Kitahara et al. |
| 2006/0213429 | A1 | 9/2006 | Motoki et al. |
| 2007/0081857 | A1 | 4/2007 | Yoon |
| 2007/0093073 | A1 | 4/2007 | Farrell et al. |
| 2007/0101932 | A1 | 5/2007 | Schowalter et al. |
| 2007/0153866 | A1 | 7/2007 | Shchegrov et al. |
| 2007/0184637 | A1 | 8/2007 | Haskell et al. |
| 2007/0259464 | A1 | 11/2007 | Bour et al. |
| 2007/0272933 | A1 | 11/2007 | Kim et al. |
| 2007/0280320 | A1 | 12/2007 | Feezell et al. |
| 2008/0029152 | A1 | 2/2008 | Milshtein et al. |
| 2008/0251020 | A1 | 10/2008 | Franken et al. |
| 2008/0283851 | A1 | 11/2008 | Akita |
| 2008/0298409 | A1 | 12/2008 | Yamashita et al. |
| 2008/0308815 | A1 | 12/2008 | Kasai et al. |
| 2009/0021723 | A1 | 1/2009 | De Lega |
| 2009/0061857 | A1 | 3/2009 | Kazmi |
| 2009/0066241 | A1 | 3/2009 | Yokoyama |
| 2009/0080857 | A1 | 3/2009 | St. John-Larkin |
| 2009/0153752 | A1 | 6/2009 | Silverstein |
| 2009/0273005 | A1 | 11/2009 | Lin |
| 2009/0310640 | A1 | 12/2009 | Sato et al. |
| 2009/0316116 | A1 | 12/2009 | Melville et al. |
| 2009/0321778 | A1 | 12/2009 | Chen et al. |
| 2010/0006546 | A1 | 1/2010 | Young et al. |
| 2010/0006873 | A1 | 1/2010 | Raring et al. |
| 2010/0140630 | A1 | 6/2010 | Hamaguchi et al. |
| 2010/0195687 | A1 | 8/2010 | Okamoto et al. |
| 2010/0220262 | A1 | 9/2010 | DeMille et al. |
| 2010/0276663 | A1 | 11/2010 | Enya et al. |
| 2010/0290498 | A1 | 11/2010 | Hata et al. |
| 2010/0309943 | A1 | 12/2010 | Chakraborty et al. |
| 2011/0031508 | A1 | 2/2011 | Hamaguchi et al. |
| 2011/0056429 | A1 | 3/2011 | Raring et al. |
| 2011/0073888 | A1 | 3/2011 | Ueno et al. |
| 2011/0075694 | A1 | 3/2011 | Yoshizumi et al. |
| 2011/0129669 | A1 | 6/2011 | Fujito et al. |
| 2011/0150020 | A1 | 6/2011 | Haase et al. |
| 2011/0164637 | A1 | 7/2011 | Yoshizumi et al. |
| 2011/0180781 | A1 | 7/2011 | Raring et al. |
| 2011/0182056 | A1 | 7/2011 | Trottier et al. |
| 2011/0188530 | A1 | 8/2011 | Lell et al. |
| 2011/0216795 | A1 | 9/2011 | Hsu et al. |
| 2011/0247556 | A1 | 10/2011 | Raring et al. |
| 2011/0281422 | A1 | 11/2011 | Wang et al. |
| 2011/0286484 | A1 | 11/2011 | Raring et al. |
| 2012/0104359 | A1 | 5/2012 | Felker et al. |
| 2012/0178198 | A1 | 7/2012 | Raring et al. |
| 2012/0187371 | A1 | 7/2012 | Raring et al. |
| 2012/0314398 | A1 | 12/2012 | Raring et al. |
| 2013/0016750 | A1 | 1/2013 | Raring et al. |
| 2013/0022064 | A1 | 1/2013 | Raring et al. |
| 2013/0044782 | A1 | 2/2013 | Raring |
| 2013/0064261 | A1 | 3/2013 | Sharma et al. |

FOREIGN PATENT DOCUMENTS

| | | |
|---|---|---|
| CN | 1702836 | 11/2005 |
| CN | 1781195 | 5/2006 |
| CN | 101079463 | 11/2007 |
| CN | 101099245 | 1/2008 |
| CN | 101171692 | 4/2008 |
| JP | 3-287770 | 12/1991 |
| WO | WO 2004/084275 | 9/2004 |
| WO | 2008/041521 | 4/2008 |
| WO | WO 2010/120819 | 10/2010 |

OTHER PUBLICATIONS

International Search Report of PCT Application No. PCT/US2010/030939, dated Jun. 16, 2010, 9 pages total.

Communication from the Chinese Patent Office re 200980134723.8 dated Jun. 27, 2013, 19 pages.

USPTO Notice of Allowance for U.S. Appl. No. 12/868,441 dated Sep. 18, 2013, 13 pages.

USPTO Office Action for U.S. Appl. No. 13/114,806 dated Aug. 26, 2013, 22 pages.

International Preliminary Report & Written Opinion of PCT Application No. PCT/US2011/037792, dated Sep. 8, 2011, 13 pages total.

Tyagi et al., 'Semipolar (1011) InGaN/GaN Laser Diodes on Bulk GaN Substrates,' Japanese Journal of Applied Physics, vol. 46, No. 19, 2007, pp. L444-L445.

USPTO Office Action for U.S. Appl. No. 12/995,946 dated Jan. 29, 2013.

USPTO Office Action for U.S. Appl. No. 12/534,838 dated May 3, 2011.

USPTO Office Action for U.S. Appl. No. 12/534,838 dated Jan. 13, 2012.

USPTO Office Action for U.S. Appl. No. 12/534,838 dated Mar. 20, 2012.

USPTO Notice of Allowance for U.S. Appl. No. 12/534,838 dated Jun. 8, 2012.

USPTO Office Action for U.S. Appl. No. 12/859,153 dated Feb. 26, 2013.

USPTO Office Action for U.S. Appl. No. 12/942,817 dated Feb. 20, 2013.

USPTO Notice of Allowance for U.S. Appl. No. 13/108,645 dated Jan. 28, 2013.

(56) References Cited

OTHER PUBLICATIONS

USPTO Office Action for U.S. Appl. No. 13/291,922 dated Feb. 20, 2013.
USPTO Office Action for U.S. Appl. No. 13/425,354 dated Feb. 14, 2013.
USPTO Office Action for U.S. Appl. No. 13/548,312 dated Mar. 12, 2013.
USPTO Office Action for U.S. Appl. No. 13/606,894 dated Feb. 5, 2013.
Adesida et al., 'Characteristics of chemically assisted ion beam etching of gallium nitride', Applied Physics Letters, vol. 65, No. 7, 1994, pp. 889-891.
Behfar et al., 'Progress in Etched Facet Technology for GaN and Blue Lasers', Proc. of SPIE., vol. 6473, 64731F, 2007, pp. 1-8.
International Preliminary Report & Written Opinion of PCT Application No. PCT/US2011/060030 dated Mar. 21, 2012, 11 pgs. total.
USPTO Notice of Allowance for U.S. Appl. No. 12/749,466 dated Jan. 2, 2013.
USPTO Office Action for U.S. Appl. No. 12/787,343 dated Dec. 17, 2012.
USPTO Notice of Allowance for U.S. Appl. No. 12/787,343 dated Jun. 10, 2013.
USPTO Notice of Allowance for U.S. Appl. No. 12/789,303 dated Dec. 21, 2012.
USPTO Office Action for U.S. Appl. No. 12/868,441 dated Dec. 18, 2012.
USPTO Office Action for U.S. Appl. No. 13/114,806 dated Apr. 12, 2013.
USPTO Office Action for U.S. Appl. No. 13/291,922 dated Jun. 18, 2013.
USPTO Office Action for U.S. Appl. No. 13/548,635 dated Jun. 14, 2013.
USPTO Notice of Allowance for U.S. Appl. No. 13/606,894 dated May 24, 2013.
Chinese Office Action From Chinese Patent Application No. 200980134723.8 dated Nov. 1, 2012, 22 pgs. (With Translation).
Founta et al., 'Anisotropic Morphology of Nonpolar a-Plane GaN Quantum Dots and Quantum Wells,' Journal of Applied Physics, vol. 102, vol. 7, 2007, pp. 074304-1-074304-6.
Franssila, 'Tools for CVD and Epitaxy', Introduction to Microfabrication, 2004, pp. 329-336.
Zhong et al., 'Demonstration of High Power Blue-Green Light Emitting Diode on Semipolar (1122) Bulk GaN Substrate,' Electronics Letters, vol. 43, No. 15, 2007, pp. 825-826.
USPTO Office Action for U.S. Appl. No. 12/481,543 dated Jun. 27, 2011.
USPTO Office Action for U.S. Appl. No. 12/482,440 dated Feb. 23, 2011.
USPTO Office Action for U.S. Appl. No. 12/482,440 dated Aug. 12, 2011.
USPTO Office Action for U.S. Appl. No. 12/484,924 dated Apr. 14, 2011.
USPTO Office Action for U.S. Appl. No. 12/491,169 dated Oct. 22, 2010.
USPTO Office Action for U.S. Appl. No. 12/491,169 dated May 11, 2011.
USPTO Notice of Allowance for U.S. Appl. No. 12/497,289 dated May 22, 2012.
USPTO Office Action for U.S. Appl. No. 12/534,829 dated Apr. 19, 2011.
USPTO Notice of Allowance for U.S. Appl. No. 12/534,829 dated Oct. 28, 2011.
USPTO Notice of Allowance for U.S. Appl. No. 12/534,829 dated Dec. 5, 2011.
USPTO Notice of Allowance for U.S. Appl. No. 12/534,829 dated Dec. 21, 2011.
USPTO Office Action for U.S. Appl. No. 12/573,820 dated Mar. 2, 2011.
USPTO Office Action for U.S. Appl. No. 12/749,466 dated Jun. 29, 2011.
USPTO Office Action for U.S. Appl. No. 12/749,466 dated Jul. 3, 2012.
USPTO Office Action for U.S. Appl. No. 12/759,273 dated Jun. 26, 2012.
USPTO Notice of Allowance for U.S. Appl. No. 12/762,269 dated Apr. 23, 2012.
USPTO Office Action for U.S. Appl. No. 12/762,271 dated Jun. 6, 2012.
USPTO Notice of Allowance for U.S. Appl. No. 12/762,271 dated Aug. 8, 2012.
USPTO Notice of Allowance for U.S. Appl. No. 12/778,718 dated Apr. 3, 2012.
USPTO Notice of Allowance for U.S. Appl. No. 12/778,718 dated Jun. 13, 2012.
USPTO Office Action for U.S. Appl. No. 12/789,303 dated Sep. 24, 2012.
USPTO Office Action for U.S. Appl. No. 12/859,153 dated Sep. 25, 2012.
USPTO Office Action for U.S. Appl. No. 12/868,441 dated Apr. 30, 2012.
USPTO Office Action for U.S. Appl. No. 12/880,803 dated Feb. 22, 2012.
USPTO Notice of Allowance for U.S. Appl. No. 12/880,803 dated Jul. 18, 2012.
USPTO Office Action for U.S. Appl. No. 12/883,093 dated Mar. 13, 2012.
USPTO Office Action for U.S. Appl. No. 12/883,093 dated Aug. 3, 2012.
USPTO Notice of Allowance for U.S. Appl. No. 12/883,093 dated Nov. 21, 2012.
USPTO Office Action for U.S. Appl. No. 12/883,652 dated Apr. 17, 2012.
USPTO Office Action for U.S. Appl. No. 12/884,993 dated Mar. 16, 2012.
USPTO Office Action for U.S. Appl. No. 12/884,993 dated Aug. 2, 2012.
USPTO Notice of Allowance for U.S. Appl. No. 12/884,993 dated Nov. 26, 2012.
USPTO Office Action for U.S. Appl. No. 12/995,946 dated Mar. 28, 2012.
USPTO Office Action for U.S. Appl. No. 13/014,622 dated Nov. 28, 2011.
USPTO Office Action for U.S. Appl. No. 13/014,622 dated Apr. 30, 2012.
USPTO Office Action for U.S. Appl. No. 13/046,565 dated Apr. 13, 2012.
USPTO Office Action for U.S. Appl. No. 13/046,565 dated Jul. 19, 2012.
USPTO Office Action for U.S. Appl. No. 13/354,639 dated Nov. 7, 2012.
USPTO Notice of Allowance for U.S. Appl. No. 13/354,639 dated Dec. 14, 2012.
Non-Final Office Action of Feb. 13, 2014 for U.S. Appl. No. 13/114,806 23 pages.

\* cited by examiner

An example embodiment on semipolar (11-22) oriented GaN

An example embodiment on semipolar (11-22) oriented GaN

An example embodiment on semipolar (11-22) oriented GaN

An example embodiment on nonpolar (10-10) oriented GaN

An example embodiment on nonpolar (10-10) oriented GaN

INTEGRATED LASER DIODES WITH QUALITY FACETS ON GAN SUBSTRATES

CROSS-REFERENCES TO RELATED APPLICATIONS

This application is a continuation in part of U.S. application Ser. No. 12/502,058 filed on Jul. 13, 2009, which claims priority to U.S. Provisional Patent Application Ser. No. 61/080,655 filed on Jul. 14, 2008, entitled INTEGRATED TOTAL INTERNAL REFLECTORS FOR HIGH-GAIN LASER DIODES WITH HIGH QUALITY CLEAVED FACETS ON NONPOLAR/SEMIPOLAR GaN SUBSTRATES by inventors JAMES W. RARING and DANIEL F. FEEZELL, commonly assigned and incorporated by reference herein for all purposes.

BACKGROUND OF THE INVENTION

The present invention relates generally to lighting techniques. More specifically, the present invention provides a method and device using multi-directional laser cavities having improved facets. Merely by way of example, the invention can be applied to applications such as white lighting, multi-colored lighting, general illumination, decorative lighting, automotive and aircraft lamps, street lights, lighting for plant growth, indicator lights, lighting for flat panel displays, other optoelectronic devices, and the like.

In the late 1800's, Thomas Edison invented the lightbulb. The conventional lightbulb, commonly called the "Edison bulb," has been used for over one hundred years. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light. Unfortunately, drawbacks exist with the conventional Edison light bulb. That is, the conventional light bulb dissipates much thermal energy. More than 90% of the energy used for the conventional light bulb dissipates as thermal energy. Additionally, the conventional light bulb routinely fails often due to thermal expansion and contraction of the filament element.

In 1960, the laser was first demonstrated by Theodore H. Maiman at Hughes Research Laboratories in Malibu. This laser utilized a solid-state flashlamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the wall plug efficiency of the LPSS lasers to 5-10%, and further commercialization ensue into more high end specialty industrial, medical, and scientific applications. However, the change to diode pumping increased the system cost and required precise temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulate-able, they suffer from severe sensitivity to temperature which limits their application.

From the above, it is seen that techniques for improving optical devices is highly desired.

BRIEF SUMMARY OF THE INVENTION

According to the present invention, techniques related to lighting are provided. More specifically, the present invention provides a method and device using multi-directional laser cavities having improved facets. Merely by way of example, the invention can be applied to applications such as white lighting, multi-colored lighting, general illumination, decorative lighting, automotive and aircraft lamps, street lights, lighting for plant growth, indicator lights, lighting for flat panel displays, other optoelectronic devices, and the like.

In a specific embodiment, the present invention provides a laser diode device operable at a one or more wavelength ranges. The device has a first waveguide provided on a non-polar or semipolar crystal plane of gallium containing material. In a specific embodiment, the first waveguide has a first gain characteristic and a first direction. In a specific embodiment, the first waveguide has a first end and a second end and a first length defined between the first end and the second end. The device has a second waveguide provided on a non-polar or semipolar crystal plane of gallium containing material. In a specific embodiment, the second waveguide has a second gain characteristic and a second direction. In a specific embodiment, the second waveguide has a first end, a second end, and a second length defined between the first end and the second end. In a specific embodiment, the second waveguide has the first end being coupled to the first end of the first waveguide. The second length is in a different direction from the second length. In a specific embodiment, the device has a cleaved region provided on the second end of the second waveguide, the cleaved region being substantially perpendicular to the second direction of the second waveguide. In a preferred embodiment, the first and second waveguides are continuous, are formed as a single continuous waveguide structure, and are formed together during manufacture of the waveguides. Of course, there can be other variations, modifications, and alternatives.

In yet an alternative specific embodiment, the present invention provides an optical device, e.g., laser. The device includes a gallium and nitrogen containing material having a surface region, which is characterized by a semipolar (11–22) surface orientation. The device also has a first waveguide region configured in a first direction, which is a projection of a c-direction or [–1–123] overlying the surface region of the gallium and nitrogen containing material in a specific embodiment. The device also has a second waveguide region coupled to the first waveguide region and is configured in a second direction overlying the surface region of the gallium and nitrogen containing material. In a preferred embodiment, the second direction is different from the first direction and substantially parallel to the m-direction. In a preferred embodiment, the first and second waveguide regions are continuous, are formed as a single continuous waveguide structure, and are formed together during manufacture of the waveguides. Of course, there can be other variations, modifications, and alternatives.

In an alternative specific embodiment, the present invention provides an optical device, e.g., laser. The device includes a gallium and nitrogen containing material having a surface region, which is characterized by a non-polar surface orientation. The device also has a first waveguide region configured in a first direction, which is in a c-direction overlying the surface region of the gallium and nitrogen containing material. The device also has a second waveguide region coupled to the first waveguide region and configured in a second direction overlying the surface region of the gallium and nitrogen containing material. In a preferred embodiment, the second direction is different from the first direction. In a preferred embodiment, the first and second waveguide regions are continuous, are formed as a single continuous waveguide structure, and are formed together during manufacture of the waveguides. Of course, there can be other variations, modifications, and alternatives.

In one or more embodiments, the present structure and method also include waveguide structures having quantum well configurations made using epitaxial materials of gallium and nitrogen containing materials. Such configurations are described more particularly below.

One or more benefits may be achieved using one or more of the specific embodiments. As an example, the present device and method provides for higher yields over conventional techniques in fabricating laser devices. In other embodiments, the present method and resulting structure are easier to form by way of a preferential cleaving plane in a gallium nitride containing crystalline material. In one or more preferred embodiments, the present method and structure provide for improved an improved gain characteristic for a laser device using a waveguide and associated cavity oriented in a first direction and an improved or desirable cleave characteristic for forming cleaved facets using a waveguide oriented in a second direction, which is different from the first direction. In one or more embodiments, the present method and structure also takes advantage of the anisotropic characteristic of one or more electromagnetic emissions from the semipolar and/or nonpolar oriented gallium nitride material configured as an optical device. As an example, a description of anisotropy and waveguide gain can be found in D. S. Sizov et al. "500-nm Optical Gain Anisotropy of Semipolar (11–22) InGaN Quantum Wells", Applied Physics Express, No. 2, 071001, 2009, which is hereby incorporated by reference for all purposes. Depending upon the embodiment, one or more of these benefits can be achieved. These and other benefits are further described throughout the present specification and more particularly below.

The present invention achieves these benefits and others in the context of known process technology. However, a further understanding of the nature and advantages of the present invention may be realized by reference to the latter portions of the specification and attached drawings.

DETAILED DESCRIPTION OF THE INVENTION

Figure 1:
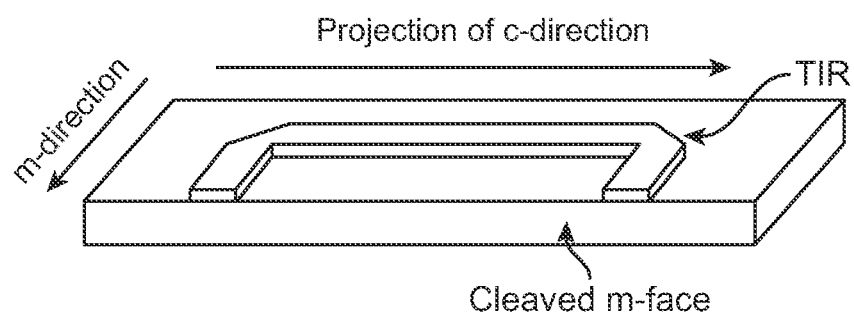
FIGS. 1-3 are simplified diagrams of optical devices according to embodiments of the present invention.

According to the present invention, techniques related to lighting are provided. More specifically, the present invention provides a method and device using multi-directional laser cavities having improved facets. Merely by way of example, the invention can be applied to applications such as full color laser display systems, white lighting, multi-colored lighting, general illumination, decorative lighting, automotive and aircraft lamps, street lights, lighting for plant growth, indicator lights, lighting for flat panel displays, other optoelectronic devices, and the like.

In a specific embodiment, epitaxial layers grown on nonpolar and semipolar crystal orientations exhibit gain anisotropy where the amount of available gain the laser cavity is dependent on at least the orientation or direction of the cavity itself. For improved laser performance, it is desirable to maximize the gain in the cavity. However, the laser should also possess high-quality mirrors for best or improved performance. The quality of the mirror is characterized by the smoothness and verticality, which ultimately dictate the reflectivity, and possibly other factors. Furthermore, for purposes of manufacturing, it is desirable to have a mirror fabrication technique that is straightforward, fast, and relatively inexpensive. A technique to realize Fabry Perot laser mirrors is to use high-quality cleaved facets, which are made using cleaving techniques. Unfortunately, we learned that the ease (and quality) of which the cleaved mirrors are formed are dependant upon the crystal orientation of the cleave plane(s). Some crystallographic orientations do not readily cleave and do not easily yield high quality mirrors. Conventional laser diodes orient the gain providing laser stripe orthogonal to the cleaved mirrors. However, on nonpolar and semipolar GaN crystal planes with anisotropic gain characteristics, such configurations will not always provide the desirable cleave plane for mirrors and maximum gain in the laser cavity. These and other limitations may be overcome by way of the present method and structures, which are more fully described below.

As used herein, the term gallium nitride substrate material is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semipolar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero). Of course, there can be other meanings understood by one of ordinary skill in the art, including modifications, alternatives, and variations.

Additionally, the present structures and method refer to non-polar or semipolar crystal orientations for gallium and nitrogen containing materials according to one or more embodiments. In a specific embodiment, the non-polar crystal orientation may include the m-plane (10–10) non-polar orientation, but can be one or more in the family of [1–100] non-polar crystal orientations. In a specific embodiment, the semipolar crystal orientation may include (11–22) semipolar, but can be one or more in the same family of semipolar crystal orientations. In one or more other embodiments, the semipolar crystal orientation may include a direction toward projection of c-plane, as an example [−1−123] semipolar crystal orientations, or other crystal orientations within the same family. Other variations such as the use of the semipolar crystal plane (10−1−1) or like can also exist. In other embodiments, the non-polar or semipolar orientations may have slight offsets, misorientations, or miscuts, or the like, including combinations. In a specific embodiment, the slight offsets can include any and all orientations within +/−5 or 10 degrees or more from any of the primary planes listed herein or outside of the specification. Of course, there can be other variations, modifications, and alternatives.

In a preferred embodiment, the present invention provides for a structure and method to orient the laser strip for maximum gain in one direction and then redirect the light within the cavity in another direction where high quality cleaved facets can be achieved orthogonal to the propagating light. In one or more embodiment, the other direction can also provide gain in the laser cavity. In one or more embodiments, the maximum gain direction may be normal to the other direction or be configured in almost any other spatial relationship, including use of intermediary laser cavity regions. Of course, there can be other variations, modifications, and alternatives.

In other embodiments, the present invention provides a gallium and nitrogen nonpolar or semipolar substrate having a laser diode device thereon. The laser diode device has a first waveguide section provided on the nonpolar or semipolar substrate and extending in a c-direction or a projection of a c-direction. The first waveguide section has a first gain and loss characteristic and has a first end and a second end. The device also has a second waveguide section provided on the nonpolar or semipolar substrate and is substantially perpendicular to the first waveguide section and extending in an a-direction or an m-direction. The second waveguide section has a second gain and loss characteristic and extends between the first end of the first waveguide section. The second waveguide section has a first cleaved a-face or m-face, which is substantially perpendicular to the a-direction or m-direction. The device has a total internal reflector surface configured at the first end of the first waveguide section to transmit light between the first waveguide section and the second waveguide section. The first waveguide section is configured in a perpendicular orientation to the second waveguide section, and the first gain characteristic is larger than the second gain characteristic.

In a specific embodiment, the laser device has variations. That is, the first end and the second end are separated by at least about 100 microns. In certain embodiments, the first end and the second end are separated by at least about 400 microns. In certain embodiments, the first end and the first m cleaved face are separated by at least about 5 microns. In certain embodiments, the first end and the first m cleaved face are separated by at least about 50 microns. In a specific embodiment, the semipolar surface orientation is (11–22). In certain embodiments, the first waveguide section extends in a [−1−123] direction. In other embodiments, the semipolar surface orientation is selected from (20–21), (20–2–1), (30–31), and (30–3–1). The semipolar surface orientation is characterized by an offcut of any of these orientations within +/5 degrees toward c-plane and/or +/−5 degrees toward a-plane or the nonpolar surface orientation is characterized by an m-plane. The non-polar surface is characterized by an offcut of these orientations within +/5 degrees toward c-plane and +/−5 degrees toward a-plane. In certain embodiments, the a-cleaved face or m-cleaved face has a surface roughness of less than about 5 nm or 10 nm.

In an alternative specific embodiment, the present invention provides a method for fabricating a laser diode. The method includes providing a gallium and nitrogen containing substrate having a surface region characterized by a nonpolar or semipolar surface orientation. The method includes forming a multi-directional waveguide structure having at least a first waveguide region configured in a c-direction or a projection of c-direction. The second waveguide region is coupled to the first waveguide region by a first surface having total internal reflection. The second waveguide region extends in an a-direction or an m-direction from the first surface to a first a-cleaved face or and m-cleaved face. The device has a third waveguide region coupled to the first waveguide region by a second surface having total internal reflection. The third waveguide region extends in an a-direction or an m-direction from the second surface to a second a-cleaved face or m-cleaved face. In a specific embodiment, the semipolar surface orientation is (11–22), or can be selected from one of (20–21), (20–2–1), (30–31), (30–3–1). The semipolar surface can also be characterized by an offcut of any of these orientations within +/5 degrees toward c-plane and/or +/−5 degrees toward a-plane. Alternatively, the nonpolar surface orientation is characterized by an m-plane, which can also be characterized by an offcut of these orientations within +/5 degrees toward c-plane and +/−5 degrees toward a-plane.

In a specific embodiment, the present invention provides a method to orient laser stripes on nonpolar or semipolar substrates. In a preferred embodiment, the method orients laser stripes on the substrates for maximized gain while simultaneously allowing for cleaved facets to be formed in a crystallographically favorable orientation. Theoretical modeling predicts maximum gain for laser diodes oriented in the c-direction on nonpolar (m-plane) and oriented in the projection of the c-direction on semipolar GaN crystal orientations. In the case of the semipolar (11–22) crystal orientation, modeling predicts higher gain for light propagating in the [−1−123] direction, which may be referred to herein as the projection of the c-direction when discussing the semipolar (11–22) surface plane orientation, and all reported laser demonstrations to date have been configured this way. We have also discovered that there is no desirable cleavage plane normal to laser cavities oriented in the projection of the c-direction according to one or more embodiments. However, we have discovered that stripes oriented in the m-direction could benefit from the nice cleavage plane on the m-face. As a specific example, we demonstrated a cleave on the m-face, which has smooth and desirable features according to a specific embodiment. The m-face cleave is shown below in reference to FIG. 1A, but is not limited thereto.

Figure 1A:
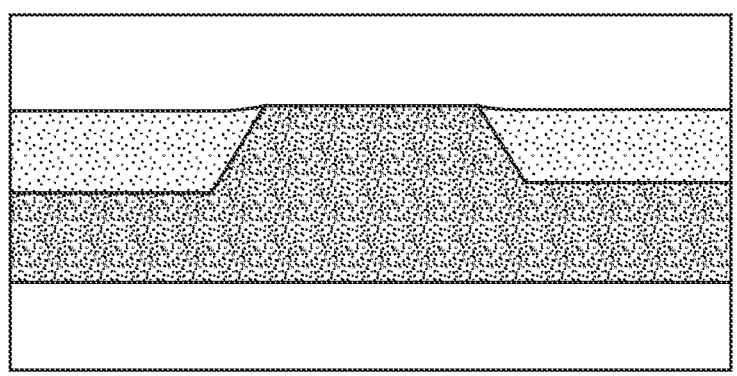
FIG. 1A is a photograph of an m-facet of a gallium and nitrogen containing substrate according to an embodiment of the present invention.

FIG. 1A is a cross-sectional image of an m-face cleave according to an embodiment of the present invention. This image is merely an example, which should not unduly limit the scope of the claims herein. One of ordinary skill in the art would recognize other variations, modifications, and alternatives. As shown, the m-direction cleaved facet is smooth and provides a suitable mirror surface. In a specific embodiment, one mirror surface has a reflectivity of about 99% and greater and the other mirror surface has a reflectivity of 65% and greater, but could be others. An example of a way to perform a cleave on a gallium nitride containing material is found in U.S. Provisional Application Ser. No. 61/168,926, entitled OPTICAL DEVICE STRUCTURE USING GaN SUBSTRATES FOR LASER APPLICATIONS by DANIEL F. FEEZELL et al., hereby incorporated by reference herein in its entirety.

Clearly, on (11–22) it would be desirable in a laser diode to exploit the high gain characteristic of projection of c-oriented laser stripes along with the cleavage properties of mirrors on the m-face. However, conventional laser diode structures with the mirrors oriented normal to the primary gain laser stripe do not facilitate this because the higher gain would be realized in the projection of the c-direction, but we have discovered higher quality cleaves on the m-plane, which is not orthogonal to the projection of the c-direction.

In the case of the nonpolar (10–10) crystal orientation the gain anisotropy theory has been verified experimentally in laser diodes where laser stripes along the c-direction have demonstrated reduced threshold current densities relative devices oriented in the a-direction. It has also been shown that such substrates will preferentially cleave along the a-plane of the crystal making this plane optimum for use as the laser mirror in cleave facet devices. However, since the a-face is oriented parallel to c-direction, these crystallographically dependent characteristics create great difficulty for the fabrication of conventional cleaved facet diode lasers with both optimized gain and high quality cleaved facets.

Figure 2:
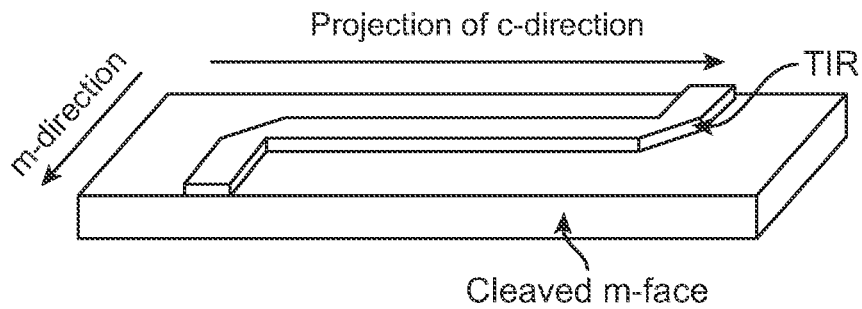
Figure 3:
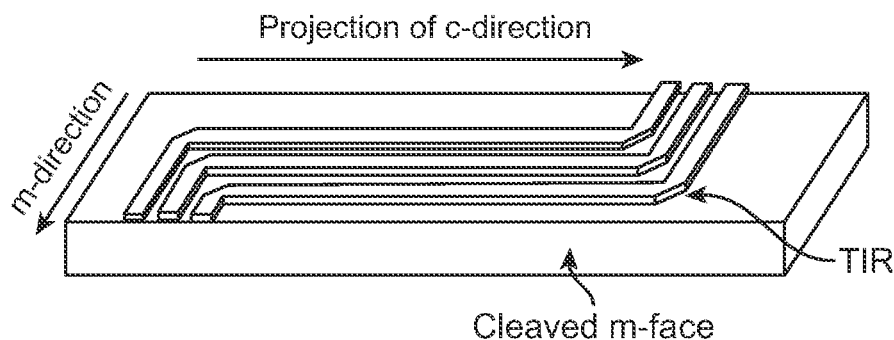

Here, we propose to integrate total internal reflectors (TIR) within the laser gain cavity on nonpolar or semipolar GaN such that the laser stripe can be oriented for maximum gain and a crystal plane that is not oriented orthogonal to the primary gain stripe can be used for the mirrors such that high quality cleaved facets can be used in the laser. On semipolar (11–22) oriented GaN, a majority of the laser stripe length will be directed substantially along the projection of c-direction to provide the laser with high gain. At the ends of the cavity there will be TIR mirrors to redirect the cavity substantially in the m-direction such that high quality m-plane cleaved facet mirrors can be implemented. Put simply, at the ends of the c-projection oriented laser cavity, the light will be turned approximately 90 degrees such that the waveguide will be normally incident to the m-plane. A specific embodiment of this concept is shown in FIG. 1 where light emission from both ends of the cavity would exit the chip from the same m-face. This laser geometry could also be arranged with the TIR mirrors directing the light in opposite directions such that there would be emission from two m-faces of the chip as shown in FIG. 2. To form high power laser arrays, these devices could be arranged in a parallel architecture such that there were multiple output waveguides adjacent to one another on the edge of the chip as shown in FIG. 3.

In a specific embodiment, the gallium nitride substrate member is a bulk GaN substrate characterized by having a semipolar crystalline surface region, but can be others. In a specific embodiment, the bulk nitride GaN substrate comprises nitrogen and has a surface dislocation density below $10^5$ cm$^{-2}$. The nitride crystal or wafer may comprise $Al_xIn_yGa_{1-x-y}N$, where $0 \leq x, y, x+y \leq 1$. In one specific embodiment, the nitride crystal comprises GaN. In one or more embodiments, the GaN substrate has threading dislocations, at a concentration between about $10^5$ cm$^{-2}$ and about $10^8$ cm$^{-2}$, in a direction that is substantially orthogonal or oblique with respect to the surface. As a consequence of the orthogonal or oblique orientation of the dislocations, the surface dislocation density is below about $10^5$ cm$^{-2}$. Of course, there can be other variations, modifications, and alternatives.

In a specific embodiment, the device has a laser stripe region formed overlying a portion of the semipolar crystalline orientation surface region. In a specific embodiment, the laser stripe region is characterized by a cavity orientation is substantially parallel to a projection in the c-direction, as noted, but can be other configurations. In a specific embodiment, the laser stripe region has a first end and a second end, as shown above. In a specific embodiment, the first end is coupled to a second laser stripe region and the second end is coupled to a third laser stripe region, but can be other configurations. Of course, there can be other variations, modifications, and alternatives.

In a preferred embodiment, the device has a first cleaved m-face facet and a second cleaved m-face facet, each of which is laser stripe region. In one or more embodiments, the first cleaved m facet is not directly facing the second cleaved m facet. Mirror surfaces are formed on each of the cleaved surfaces. The first cleaved m-facet comprises a first mirror surface. In a preferred embodiment, the first mirror surface is provided by a scribing and breaking process. The scribing process can use any suitable techniques, such as a diamond scribe or laser scribe or combinations. In a specific embodiment, the first mirror surface comprises a reflective coating. The reflective coating is selected from silicon dioxide, hafnia, and titaniatantalum pentoxidezirconia, including combinations, and the like. Depending upon the embodiment, the first mirror surface can also comprise an anti-reflective coating. Of course, there can be other variations, modifications, and alternatives.

Also in a preferred embodiment, the second cleaved m-facet comprises a second mirror surface. The second mirror surface is provided by a scribing and breaking process according to a specific embodiment. Preferably, the scribing is diamond scribed or laser scribed or the like. In a specific embodiment, the second mirror surface comprises a reflective coating, such as silicon dioxide, hafnia, and titaniatantalum pentoxidezirconia, combinations, and the like. In a specific embodiment, the second mirror surface comprises an anti-reflective coating. Of course, there can be other variations, modifications, and alternatives.

In a specific embodiment, the laser stripe has a length and width. The length ranges from about 50 microns to about 3000 microns. The strip also has a width ranging from about 0.5 microns to about 50 microns, but can be other dimensions. In a specific embodiment, the width is substantially constant in dimension, although there may be slight variations. The width and length are often formed using a masking and etching process, which are commonly used in the art. Further details of the present device can be found throughout the present specification and more particularly below.

Figure 4:
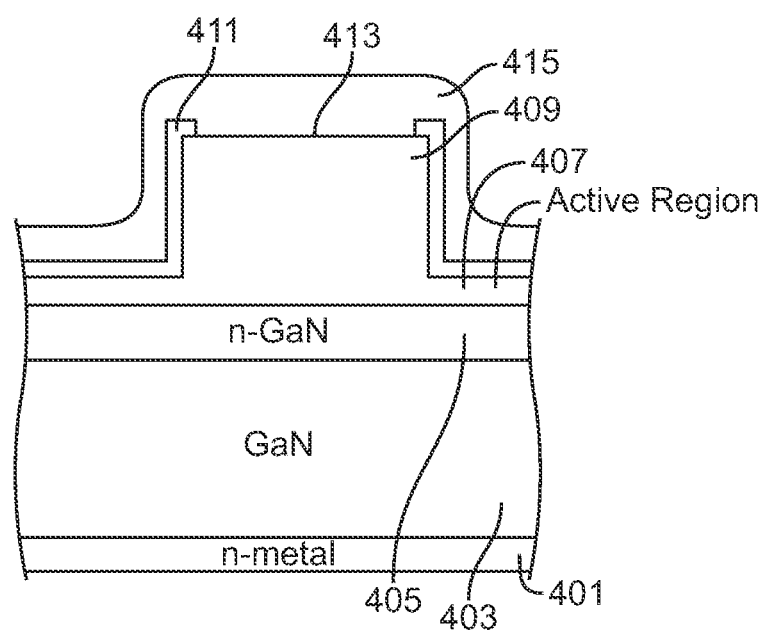
FIG. 4 is a simplified cross-sectional diagram of an optical device according to alternative embodiments of the present invention.

FIG. 4 is a detailed cross-sectional view of a laser device 400 fabricated on a semipolar substrate according to an embodiment of the present invention. This diagram is merely an example, which should not unduly limit the scope of the claims herein. One of ordinary skill in the art would recognize other variations, modifications, and alternatives. As shown, the laser device includes gallium nitride substrate 403, which has an underlying n-type metal back contact region 401. In a specific embodiment, the metal back contact region is made of a suitable material such as those noted below and others. Further details of the contact region can be found throughout the present specification and more particularly below.

In a specific embodiment, the device also has an overlying n-type gallium nitride layer 405, an active region 407, and an overlying p-type gallium nitride layer structured as a laser stripe region 409. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and $10^{20}$ cm$^{-3}$.

In a specific embodiment, an n-type $Al_uIn_vGa_{1-u-v}N$ layer, where $0 \leq u$, v, $u+v \leq 1$, is deposited on the substrate. In a specific embodiment, the carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE). Of course, there can be other variations, modifications, and alternatives.

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. In one specific embodiment, the susceptor is heated to approximately 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 and 10 sccm, is initiated.

In a specific embodiment, the laser stripe region is made of the p-type gallium nitride layer 409. In a specific embodiment, the laser stripe and TIR mirrors are provided by an etching process selected from dry etching or wet etching. In a preferred embodiment, the etching process is dry, but can be others. As an example, the dry etching process is an inductively coupled process using chlorine bearing species or a reactive ion etching process using similar chemistries. Again as an example, the chlorine bearing species are commonly derived from chlorine gas or the like. The device also has an overlying dielectric region, which exposes 413 contact region. In a specific embodiment, the dielectric region is an oxide such as silicon dioxide or silicon nitride, but can be others. The contact region is coupled to an overlying metal layer 415. The overlying metal layer is a multilayered structure containing gold and platinum (Pt/Au), but can be others. Of course, there can be other variations, modifications, and alternatives.

In a specific embodiment, the laser device has active region 407. The active region can include one to twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with 1-20 quantum wells. The quantum wells may comprise InGaN wells and GaN, InGaN, or InAlGaN barrier layers. In other embodiments, the well layers and barrier layers comprise $Al_wIn_xGa_{1-w-x}N$ and $Al_yIn_zGa_{1-y-z}N$, respectively, where $0 \leq w$, x, y, z, w+x, y+z $\leq 1$, where w<u, y and/or x>v, z so that the bandgap of the well layer(s) is less than that of the barrier layer(s) and the n-type layer. The well layers and barrier layers may each have a thickness between about 1 nm and about 40 nm. In another embodiment, the active layer comprises a double heterostructure, with an InGaN or $Al_wIn_xGa_{1-w-x}N$ layer about 10 nm to 100 nm thick surrounded by GaN or $Al_yIn_zGa_{1-y-z}N$ layers, where w<u, y and/or x>v, z. The composition and structure of the active layer are chosen to provide light emission at a preselected wavelength. The active layer may be left undoped (or unintentionally doped) or may be doped n-type or p-type. Of course, there can be other variations, modifications, and alternatives.

In a specific embodiment, the active region can also include an electron blocking region, and a separate confinement heterostructure. In some embodiments, an electron blocking layer is preferably deposited. The electron-blocking layer may comprise $Al_sIn_tGa_{1-s-t}N$, where $0 \leq s$, t, s+t $\leq 1$, with a higher bandgap than the active layer, and may be doped p-type. In one specific embodiment, the electron blocking layer comprises AlGaN. In another embodiment, the electron blocking layer comprises an AlGaN/GaN super-lattice structure, comprising alternating layers of AlGaN and GaN, each with a thickness between about 0.2 nm and about 5 nm. Of course, there can be other variations, modifications, and alternatives.

As noted, the p-type gallium nitride structure, which can be a p-type doped $Al_qIn_rGa_{1-q-r}N$, where $0 \leq q$, r, q+r $\leq 1$, layer is deposited above the active layer. The p-type layer may be doped with Mg, to a level between about $10^{16}$ cm$^{-3}$ and $10^{22}$ cm$^{-3}$, and may have a thickness between about 5 nm and about 1000 nm. The outermost 1-50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry, but can be others. The device also has an overlying dielectric region, which exposes 413 contact region. In a specific embodiment, the dielectric region is an oxide such as silicon dioxide, but can be others. Of course, there can be other variations, modifications, and alternatives.

In a specific embodiment, the metal contact is made of suitable material. The reflective electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device. Of course, there can be other variations, modifications, and alternatives. A further example of the present laser device fabrication process and structure can be found in "OPTICAL DEVICE STRUCTURE USING MISCUT GaN SUBSTRATES FOR LASER APPLICATIONS," in the names of JAMES W. RARING et al., which is listed under U.S. Provisional Application Ser. No. 61/164,409 filed Mar. 28, 2009, commonly assigned, and hereby incorporated by reference herein in its entirety.

Since lasers fabricated on nonpolar/semipolar GaN substrates demonstrate a polarization gain dependence on laser stripe direction, such devices could be used to achieve desired polarization ratios of the output radiation. That is, the relative length of the gain sections in the m-direction and projection of c-direction can be set to achieve a designed polarization ratio. TIR mirrors have been demonstrated in conventional III-V laser diodes with very low loss and relatively easy fabrication. Our invention should not exclude any of the many laser fabrication sequences that could be used to achieve this laser geometry, such as using various stripe or TIR fabrication processes.

Figure 5:
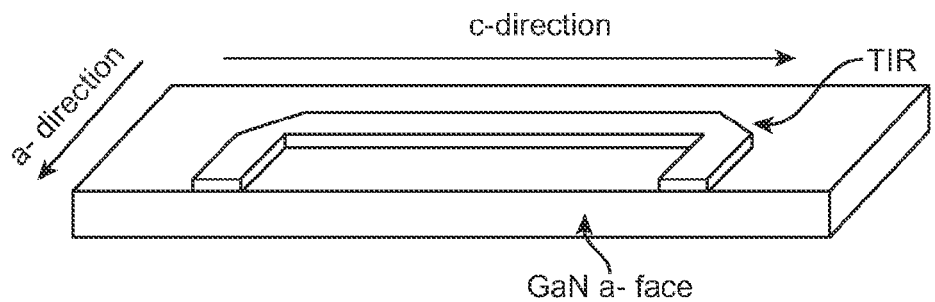
FIGS. 5-7 are simplified diagrams of optical devices according to alternative embodiments of the present invention.
Figure 6:
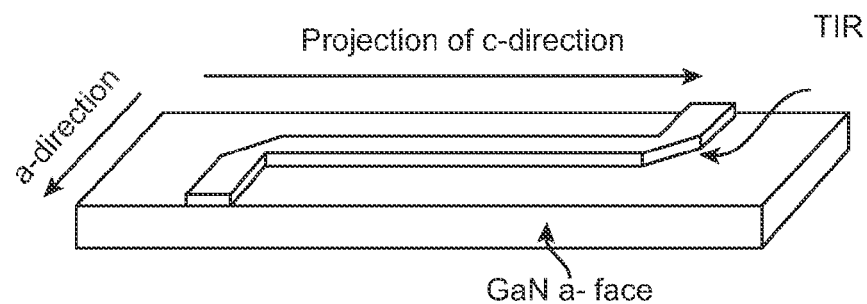
Figure 7:
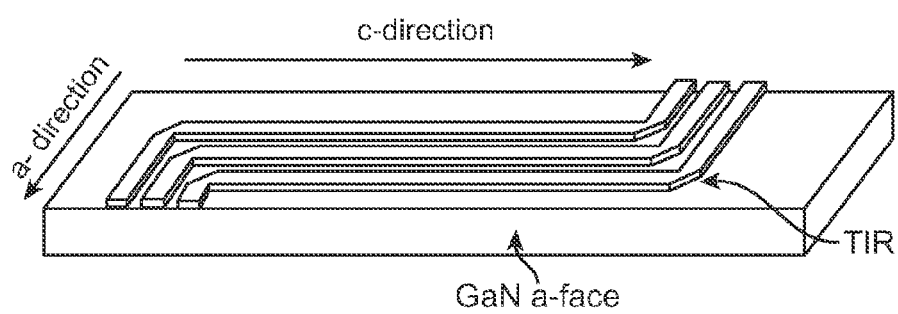

On nonpolar (10–10) GaN we propose to integrate total internal reflectors (TIR) within the laser gain cavity such that the stripe will be oriented in both the c- and a-directions. In this configuration a great majority of the stripe length will be directed along the c-direction to provide the laser with high gain. At the ends of the cavity there will be TIR mirrors to turn the cavity in the a-direction such that high quality a-plane cleaved facet mirrors can be implemented. Put simply, at the ends of the c-oriented laser cavity, the light will be turned 90 degrees such that the waveguide will be normally incident to the a-plane. One embodiment of this concept is shown in FIG. 5 where light emission from both ends of the cavity would exit the chip from the same side. This laser geometry could also be arranged with the TIR mirrors directing the light in opposite directions such that there would be emission from two sides of the chip as shown in FIG. 6. To form high power laser arrays, these devices could be arranged in a parallel architecture such that there were multiple output waveguides adjacent to one another on the edge of the chip as shown in FIG. 7.

In a specific example, the present methods and resulting structures can use various techniques. The present laser structure including a total internal reflector mirror uses a lithography and etching process. The etching process can be an inductively coupled plasma (ICP) etching, reactive ion etching (RIE), or chemical assisted ion beam (CAIBE) etching, combinations thereof, and others. In other examples, the present methods and structures can use cleaved facets formed by a scribing and breaking process. The scribing process can be preferably a laser scribe, but can also be a diamond scribe, among others.

As an example, the present method and structure provides a laser device having stripe alignment to achieve highest gain. That is, the higher gain direction will be in the c-direction for nonpolar and projection of c-direction for semipolar, as an example. In alternative examples, the present method and gallium and nitrogen containing structure (e.g.,) are configured on (20–21) and (30–31) orientations.

In other embodiments, the present laser device has variations. That is the laser device can include a third waveguide section provided on the nonpolar or semipolar substrate and is substantially perpendicular to the first waveguide section and extending in an a direction or an m-direction. The third waveguide section has a third gain and loss characteristic approximately equivalent to the second gain and loss characteristic of the second waveguide section and the third waveguide section extends between the second end of the first waveguide section. The third waveguide section has a first cleaved a-face or m-face, which is substantially perpendicular to the a-direction or m-direction. Also, the total internal reflector surface is configured at the second end of the first waveguide section to transmit essentially all light between the first waveguide section and the third waveguide section. The first waveguide section is configured in a perpendicular manner to the second waveguide section. Also, the first cleaved a-face is parallel to the second cleaved a-face or the first cleaved m-face is parallel to the second cleaved m-face and is spaced apart by approximately a width of the nonpolar or semipolar substrate. The first cleaved a-face and the second cleaved a-face or the first cleaved m-face and the second cleaved m-face are in a common plane.

In other embodiments, the device also has a fourth waveguide, a fifth waveguide, and a sixth waveguide formed on the nonpolar or semipolar substrate. The fourth waveguide is configured parallel to the first waveguide and extends in the c-direction or the projection of the c-direction. The fifth waveguide is configured parallel to the second waveguide and extends in the a-direction or the m-direction. The sixth waveguide is configured parallel to the third waveguide and extends in the m-direction. The fourth waveguide and the fifth waveguide are coupled by a third total internal reflection surface to transmit essentially all light between the fourth waveguide and the fifth waveguide. The fourth waveguide and the sixth waveguide are coupled by a fourth total internal reflection surface to transmit essentially all light between the fourth waveguide and the sixth waveguide.

Since lasers fabricated on nonpolar/semipolar GaN substrates demonstrate a polarization gain dependence on laser stripe direction, such devices could be used to achieve desired polarization ratios of the output radiation. That is, the relative length of the gain sections in the a-direction and c-direction can be set to achieve a designed polarization ratio. TIR mirrors have been demonstrated in conventional III-V laser diodes with very low loss and relatively easy fabrication. Our invention should not exclude any of the many laser fabrication sequences that could be used to achieve this laser geometry, such as using various stripe or TIR fabrication processes.

In a specific embodiment, the present method and devices can be formed on or from bulk crystalline GaN substrate materials having epitaxially grown films. The GaN materials can be associated with any Group III-nitride based materials including GaN, InGaN, AlGaN, InAlGaN or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero) according to one or more embodiments. Of course, there can be other variations, modifications, and alternatives.

Although the above has been described in terms of specific embodiments, other variations, modifications, and alternatives may exist. As an example, one or more waveguides are coupled to each other using mirrors or other reflective surfaces, such as TIR surfaces. Other embodiments may use any technique such as waveguide bends, multi-mode interferometers, or waveguide coupling schemes to reorient or redirect electromagnetic radiation from one of the first waveguides to at least one of more other waveguides. In a specific embodiment, two or more waveguides are configured to a maximum gain waveguide to reorient the electromagnetic radiation. Other embodiments may include other spatial arrangements using any combinations of waveguide shapes, sizes, spatial orientations, and spatial arrangements. Of course, there can be other variations, modifications, and alternatives.

While the above is a full description of the specific embodiments, various modifications, alternative constructions and equivalents may be used. As an example, the device can include any combination of elements described above, as well as outside of the present specification. Also, the gain characteristic can be no gain, some gain, or negative gain (loss) according to one or more embodiments. Therefore, the above description and illustrations should not be taken as limiting the scope of the present invention which is defined by the appended claims.

What is claimed is:

1. A laser diode device on a gallium and nitrogen semipolar substrate, the laser diode device comprising:
   a first waveguide section provided on the semipolar substrate extending in a projection of a c-direction, the first waveguide section having a first gain and loss characteristic and having a first end and a second end;
   a second waveguide section provided on the semipolar substrate and is substantially perpendicular to the first waveguide section and extending in an m-direction, the second waveguide section having a second gain and loss characteristic and extending between the first end of the first waveguide section and a first m-face facet, which is substantially perpendicular to the m-direction; and
   a total internal reflector surface configured at the first end of the first waveguide section to transmit light between the first waveguide section and the second waveguide section, the first waveguide section being configured in a perpendicular orientation to the second waveguide section.

2. The laser diode device as in claim 1 further comprising a third waveguide section provided on the semipolar substrate and is substantially perpendicular to the first waveguide section and extending in the m-direction, the third waveguide section having a third gain and loss characteristic approximately equivalent to the second gain and loss characteristic of the second waveguide section and the third waveguide section extending between the second end of the first waveguide section and a second m-face facet, which is substantially perpendicular to the m-direction.

3. The laser diode device as in claim 1 wherein the total internal reflector surface is configured at the second end of the first waveguide section to transmit essentially all light between the first waveguide section and the third waveguide section, the first waveguide section is configured in a perpendicular manner to the second waveguide section.

4. The laser diode device as in claim 2 wherein the first m-face facet is parallel to the second m-face facet and is spaced apart by approximately a width of the semipolar substrate.

5. The laser diode device as in claim 2 wherein the first m-face facet and the second m-face facet are in a common plane.

6. The laser diode device as in claim 2 further comprising a fourth waveguide, a fifth waveguide, and a sixth waveguide formed on the nonpolar or semipolar substrate, the fourth waveguide being configured parallel to the first waveguide and extending in the projection of the c-direction, the fifth waveguide being configured parallel to the second waveguide and extending in the m-direction, and the sixth waveguide being configured parallel to the third waveguide and extending in the m-direction.

7. The laser diode device as in claim 6 wherein:
   the fourth waveguide and the fifth waveguide are coupled by a third total internal reflection surface to transmit essentially all light between the fourth waveguide and the fifth waveguide; and
   the fourth waveguide and the sixth waveguide are coupled by a fourth total internal reflection surface to transmit essentially all light between the fourth waveguide and the sixth waveguide.

8. The laser diode device of claim 1 wherein the first gain characteristic is larger than the second gain characteristic.

9. The laser diode device of claim 1 wherein the first end and the second end are separated by at least about 100 microns.

10. The laser diode device of claim 1 wherein the first end and the second end are separated by at least about 400 microns.

11. The laser diode device of claim 1 wherein the first end and the first m-face facet are separated by at least about 5 microns.

12. The laser diode device of claim 1 wherein the first end and the first m-face facet are separated by at least about 50 microns.

13. The laser diode device of claim 1 wherein the semipolar surface orientation is (11–22).

14. The laser diode device of claim 1 wherein the first waveguide section extends in a [–1–1 2 3] direction.

15. The laser diode device of claim 1 wherein the semipolar surface orientation is selected from (2 0–2 1), (2 0–2–1), (3 0–3 1), and (3 0–3–1).

16. The laser diode device of claim 15 where the semipolar surface orientation is characterized by an offcut of the orientation.

17. The laser diode device of claim 1 wherein the m-face facet has a surface roughness of less than about 5 nm or less than 10 nm.

18. A method for fabricating a laser diode device comprising:
   providing a gallium and nitrogen containing substrate having a surface region characterized by a semipolar surface orientation; and
   forming a multi-directional waveguide structure having at least a first waveguide region configured in a projection of a c-direction on a semipolar substrate, a second waveguide region coupled to the first waveguide region by a first surface, the second waveguide region extending in an m-direction from the first surface to a first m-face facet.

19. The method of claim 18 wherein the semipolar surface orientation is (1 1–2 2), and further comprising a third waveguide region coupled to the first waveguide region by a second surface having total internal reflection, the third waveguide region extending in the m-direction from the second surface to a second m-face facet.

20. The method of claim 18 wherein the first waveguide section extends in a [–1–1 2 3] direction.

21. The method of claim 18 wherein the semipolar surface orientation is selected from one of (2 0–2 1), (2 0–2–1), (3 0–3 1), (3 0–3–1); wherein the first surface has a total internal reflectors (TIR) characteristic.

22. The method of claim 21 where the semipolar surface orientation is characterized by an offcut of the orientation.

* * * * *